United States Patent
Heng et al.

(10) Patent No.: US 10,297,556 B2
(45) Date of Patent: *May 21, 2019

(54) SEMICONDUCTOR DEVICE AND METHOD OF CONTROLLING WARPAGE IN RECONSTITUTED WAFER

(71) Applicant: STATS ChipPAC Pte. Ltd., Singapore (SG)

(72) Inventors: Kian Meng Heng, Singapore (SG); Hin Hwa Goh, Singapore (SG); Jose Alvin Caparas, Singapore (SG); Kang Chen, Singapore (SG); Seng Guan Chow, Singapore (SG); Yaojian Lin, Jiangyin (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/415,686

(22) Filed: Jan. 25, 2017

(65) Prior Publication Data
US 2017/0133330 A1    May 11, 2017

Related U.S. Application Data

(63) Continuation of application No. 14/036,193, filed on Sep. 25, 2013, now Pat. No. 9,607,965.

(51) Int. Cl.
*H01L 23/00* (2006.01)
*H01L 21/56* (2006.01)
*H01L 23/31* (2006.01)

(52) U.S. Cl.
CPC .......... *H01L 23/562* (2013.01); *H01L 21/561* (2013.01); *H01L 21/568* (2013.01);
(Continued)

(58) Field of Classification Search
CPC ....... H01L 21/56; H01L 23/28; H01L 23/526; H01L 24/96; H01L 24/19
See application file for complete search history.

(56) References Cited

U.S. PATENT DOCUMENTS

2005/0266616 A1* 12/2005 Weng .................... H01L 21/561
438/123
2009/0170241 A1    7/2009 Shim et al.
(Continued)

*Primary Examiner* — Tucker J Wright
(74) *Attorney, Agent, or Firm* — Robert D. Atkins; Patent Law Group: Atkins and Associates, P.C.

(57) ABSTRACT

A semiconductor device has a substrate with a stiffening layer disposed over the substrate. The substrate has a circular shape or rectangular shape. A plurality of semiconductor die is disposed over a portion of the substrate while leaving an open area of the substrate devoid of the semiconductor die. The open area of the substrate devoid of the semiconductor die includes a central area or interstitial locations among the semiconductor die. The semiconductor die are disposed around a perimeter of the substrate. An encapsulant is deposited over the semiconductor die and substrate. The substrate is removed and an interconnect structure is formed over the semiconductor die. By leaving the predetermined areas of the substrate devoid of semiconductor die, the warping effect of any mismatch between the CTE of the semiconductor die and the CTE of the encapsulant on the reconstituted wafer after removal of the substrate is reduced.

26 Claims, 13 Drawing Sheets

(52) U.S. Cl.
CPC .......... *H01L 23/3128* (2013.01); *H01L 24/09* (2013.01); *H01L 24/19* (2013.01); *H01L 24/49* (2013.01); *H01L 24/96* (2013.01); *H01L 24/48* (2013.01); *H01L 2224/0401* (2013.01); *H01L 2224/04042* (2013.01); *H01L 2224/12105* (2013.01); *H01L 2224/48091* (2013.01); *H01L 2924/00014* (2013.01); *H01L 2924/01322* (2013.01); *H01L 2924/12041* (2013.01); *H01L 2924/12042* (2013.01); *H01L 2924/13091* (2013.01); *H01L 2924/181* (2013.01); *H01L 2924/3511* (2013.01)

(56) References Cited

U.S. PATENT DOCUMENTS

| | | |
|---|---|---|
| 2011/0210104 A1 | 9/2011 | Wahlsten et al. |
| 2012/0171875 A1 | 7/2012 | Gan et al. |
| 2013/0032820 A1 | 2/2013 | Wirth |
| 2013/0147054 A1 | 6/2013 | Lin et al. |

\* cited by examiner

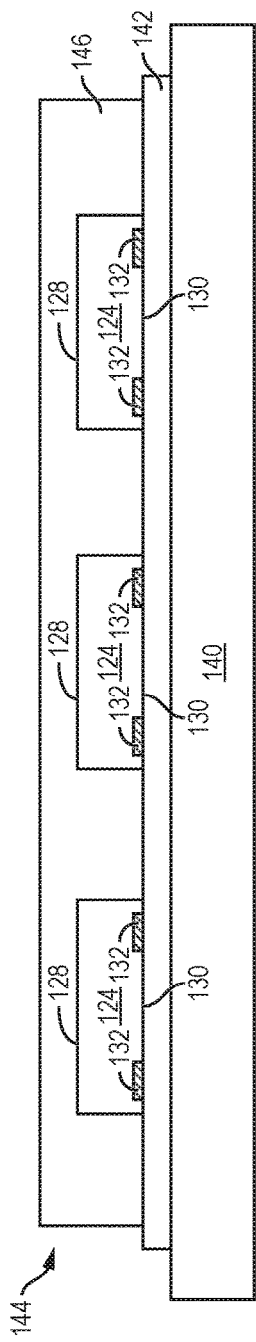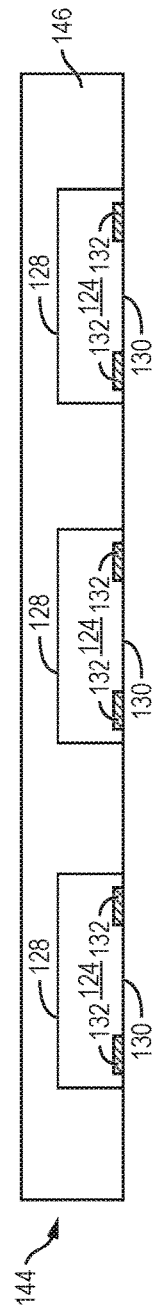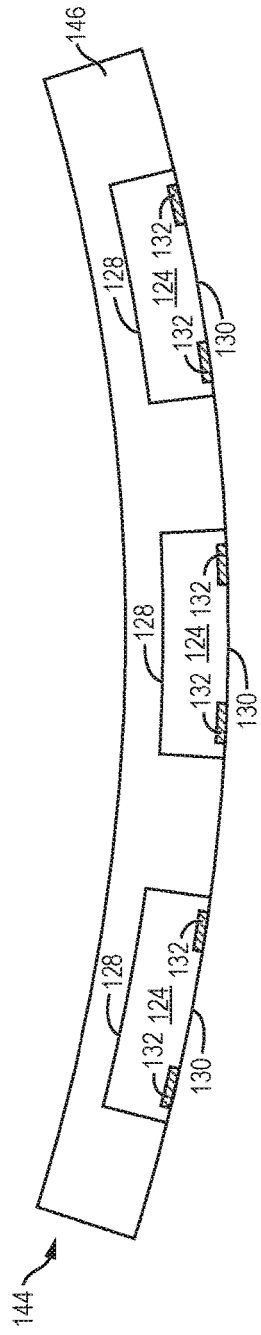

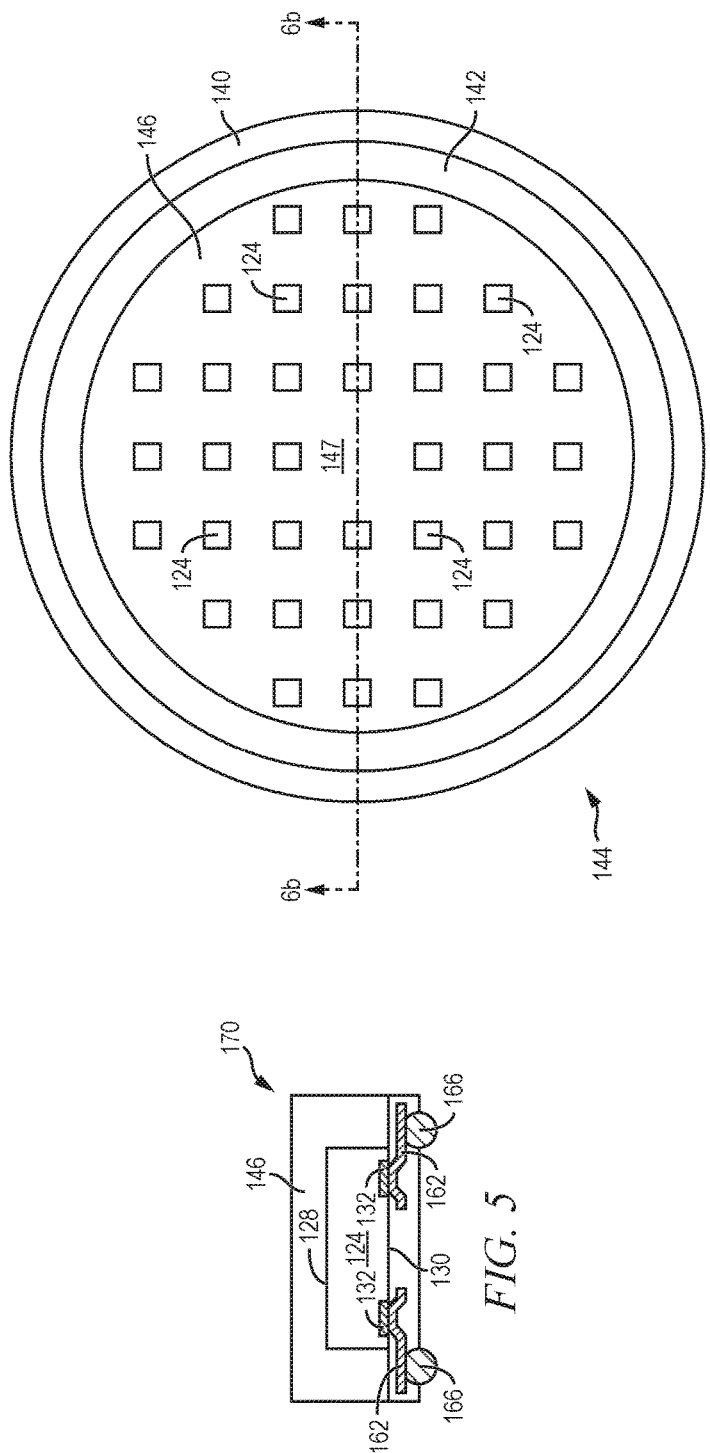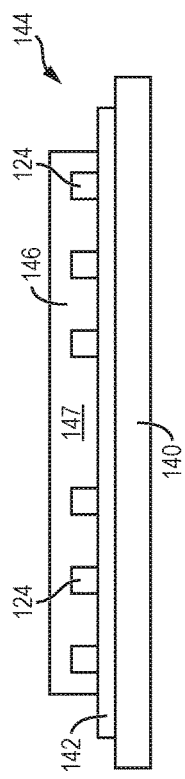

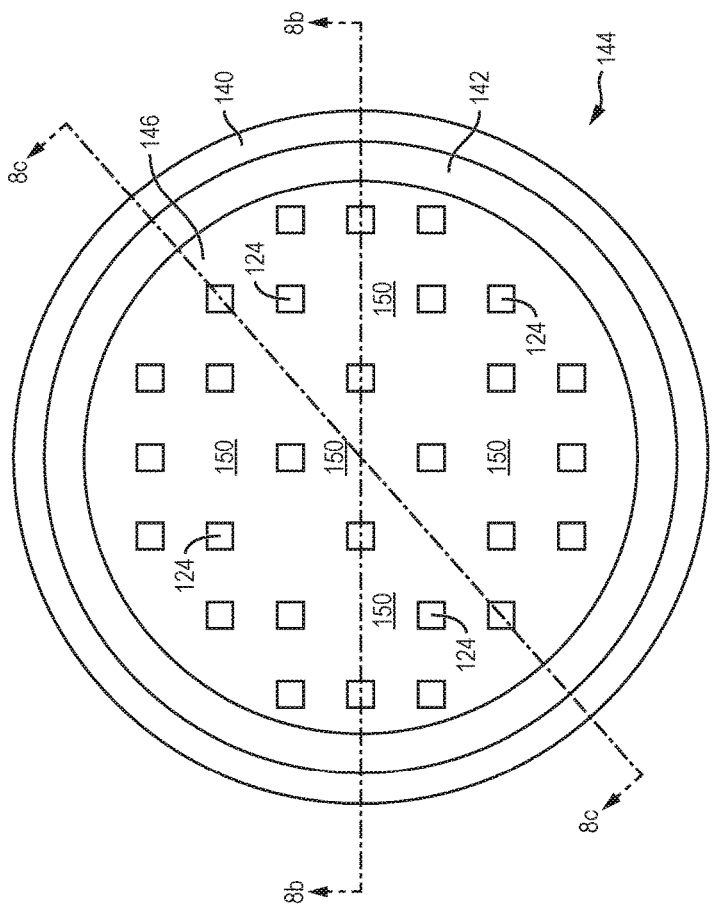
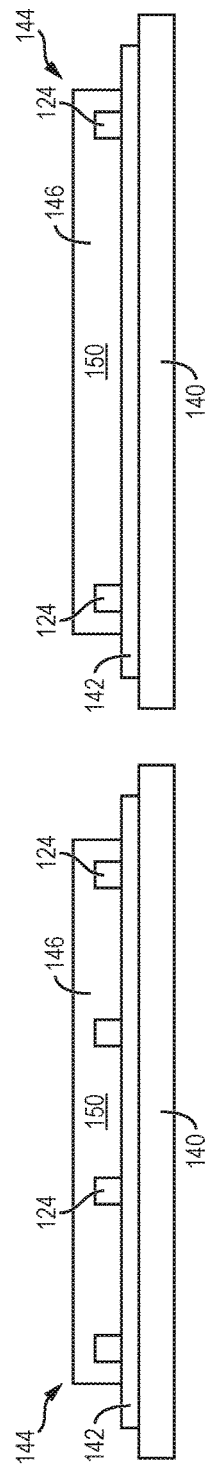
FIG. 8a
FIG. 8b
FIG. 8c

US 10,297,556 B2

SEMICONDUCTOR DEVICE AND METHOD OF CONTROLLING WARPAGE IN RECONSTITUTED WAFER

CLAIM OF DOMESTIC PRIORITY

The present application is a continuation of U.S. patent application Ser. No. 14/036,193, now U.S. Pat. No. 9,607,965, filed Sep. 25, 2013, which application is incorporated herein by reference.

FIELD OF THE INVENTION

The present invention relates in general to semiconductor devices and, more particularly, to a semiconductor device and method of controlling warpage in a reconstituted wafer by leaving open areas of a temporary carrier devoid of the semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In manufacture of a semiconductor package, a plurality of semiconductor die can be mounted to a temporary carrier. An encapsulant is deposited over the semiconductor die and carrier. The temporary carrier is then removed. The reconstituted wafer is subject to warpage or bending after removal of the carrier due to differences in CTE of the semiconductor die and encapsulant. The warpage of the reconstituted wafer creates defects and handling issues during subsequent manufacturing steps, such as during formation of an interconnect structure over the semiconductor die and encapsulant.

BRIEF DESCRIPTION OF THE DRAWINGS

FIGS. 4a-4h illustrate a process of forming a reconstituted wafer with reduced warpage by leaving open areas of a carrier devoid of the semiconductor die;

FIG. 5 illustrates a semiconductor package after singulation from the reconstituted wafer;

FIGS. 6a-6b illustrate a circular reconstituted wafer with a semiconductor die absent from a center of the wafer;

FIGS. 8a-8c illustrate a circular reconstituted wafer with multiple open areas on the carrier devoid of semiconductor die;

DETAILED DESCRIPTION OF THE DRAWINGS

Figure 1:
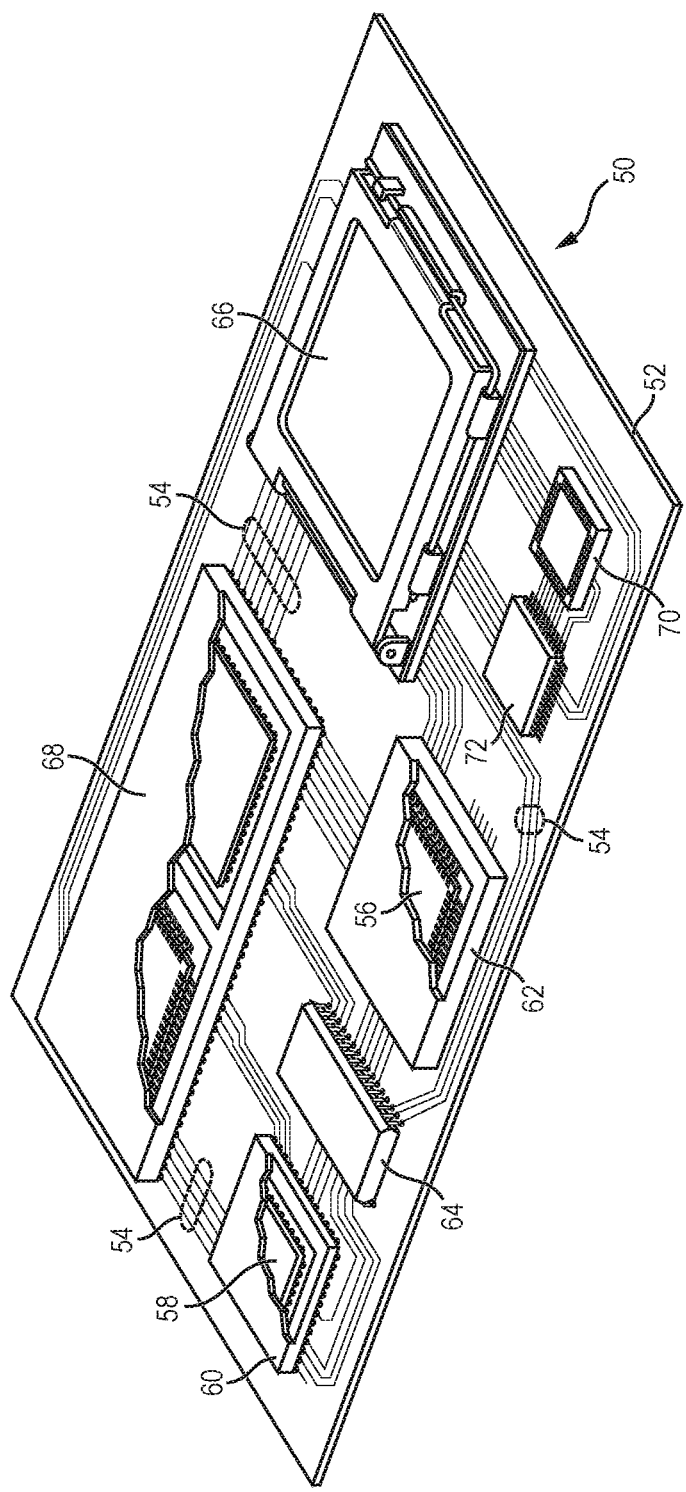
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
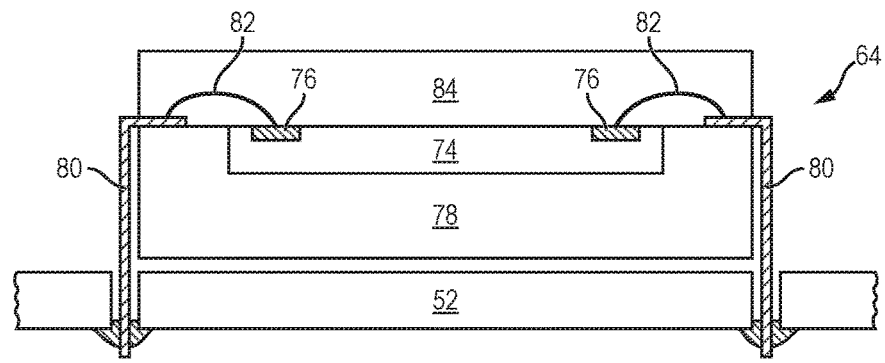
FIGS. 2a-2c illustrate further detail of the representative semiconductor packages mounted to the PCB.
Figure 2B:
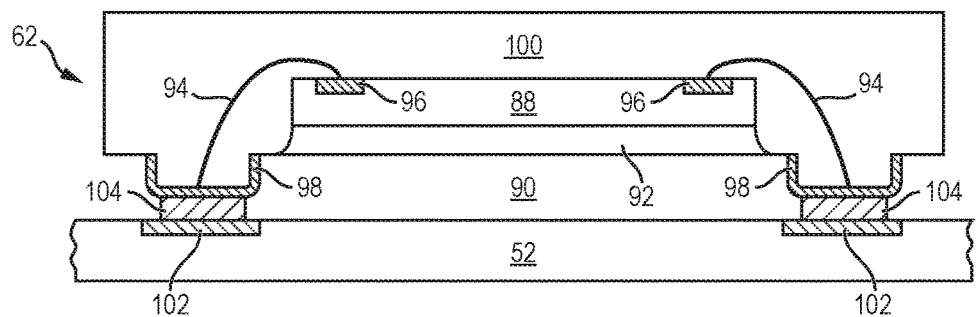
Figure 2C:
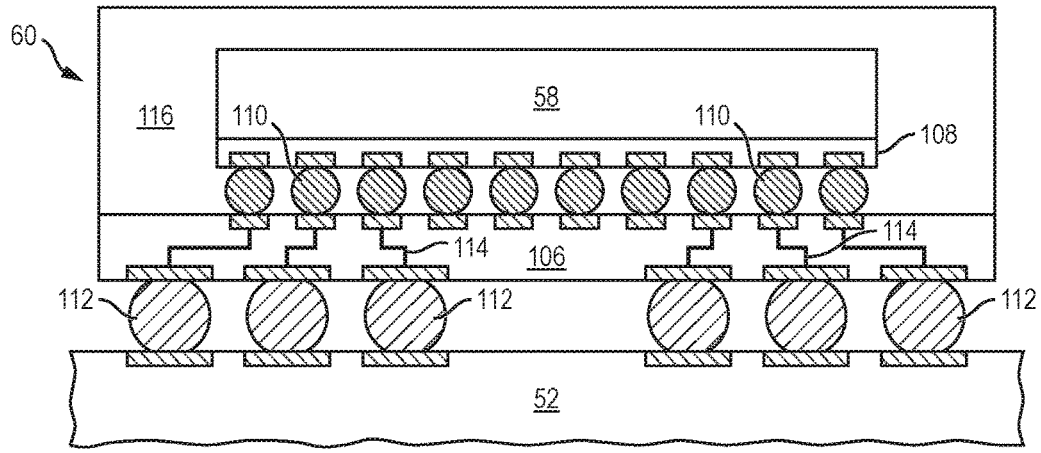

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
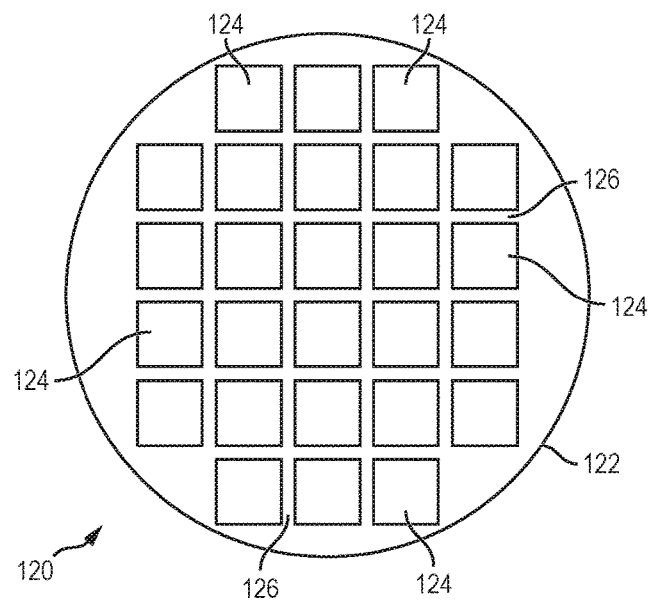
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
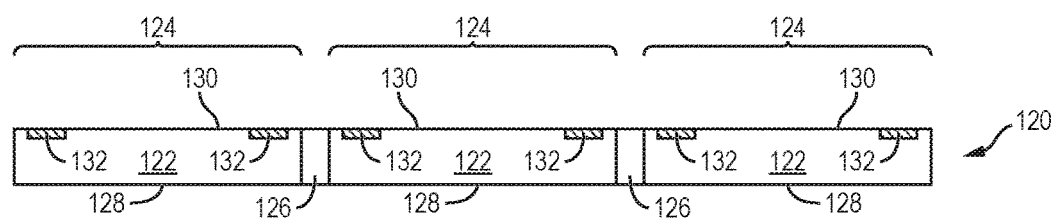

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electro-static discharge (ESD), radio frequency (RF) performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
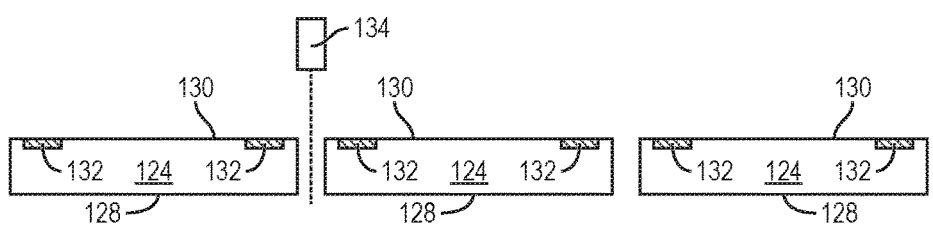

In FIG. 3c, semiconductor wafer 120 is singulated through saw street 126 using a saw blade or laser cutting tool 134 into individual semiconductor die 124. The individual semiconductor die 124 can be inspected and electrically tested for identification of KGD post singulation.

Figure 4A:
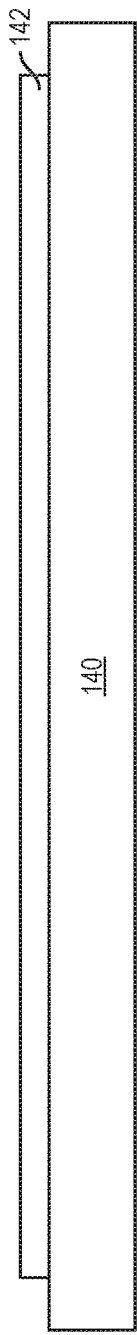

FIGS. 4a-4h illustrate, in relation to FIGS. 1 and 2a-2c, a process of forming a reconstituted wafer with reduced warpage by leaving open areas of a temporary carrier devoid of the semiconductor die. FIG. 4a shows a cross-sectional view of a portion of a carrier or temporary substrate 140 containing sacrificial base material such as silicon, polymer, beryllium oxide, glass, or other suitable low-cost, rigid material for structural support. A foil layer 142 is laminated to carrier 140. Foil layer 142 can be copper or other stiffening material to reduce warpage effects. Alternatively, an interface layer or double-sided tape 142 is formed over carrier 140 as a temporary adhesive bonding film, etch-stop layer, or thermal release layer.

Carrier 140 can be a round or rectangular panel (greater than 300 mm) with capacity for multiple semiconductor die 124. Carrier 140 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 140 is selected independent of the size of semiconductor die 124 or size of semiconductor wafer 120. That is, carrier 140 has a fixed or standardized size, which can accommodate various size semiconductor die 124 singulated from one or more semiconductor wafers 120. In one embodiment, carrier 140 is circular with a diameter of 330 mm. In another embodiment, carrier 140 is rectangular with a width of 560 mm and length of 600 mm. Semiconductor die 124 may have dimensions of 10 mm by 10 mm, which are placed on the standardized carrier 140. Alternatively, semiconductor die 124 may have dimensions of 20 mm by 20 mm, which are placed on the same standardized carrier 140. Accordingly, standardized carrier 140 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 140 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Figure 4B:
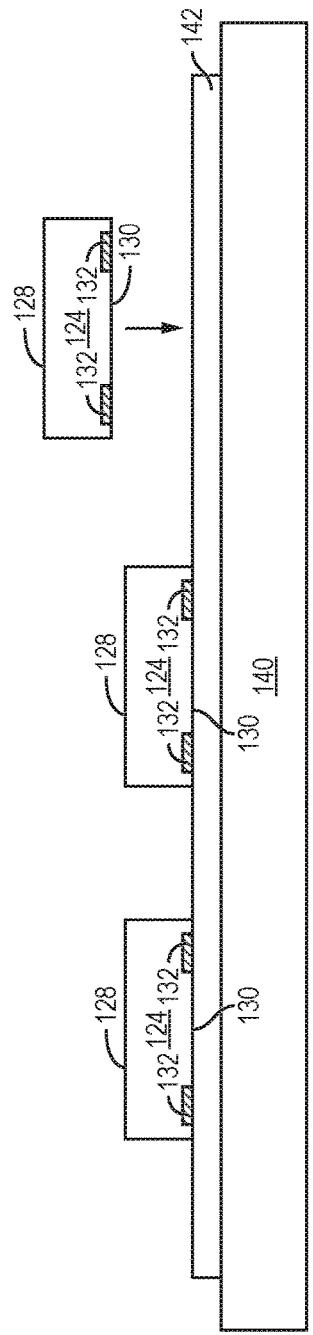
Figure 4C:
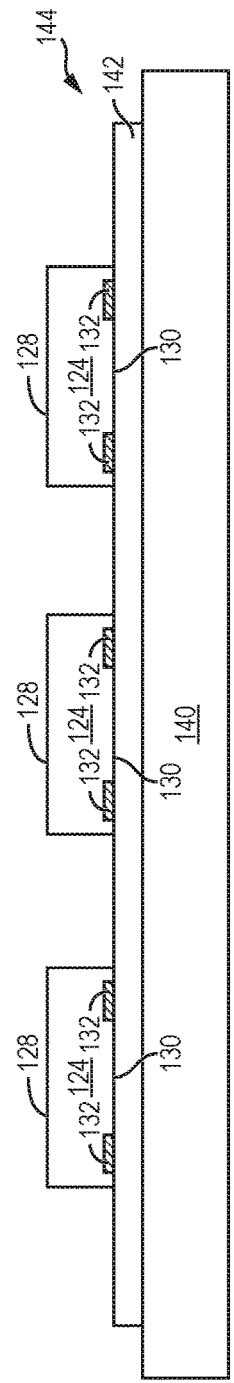

In FIG. 4b, semiconductor die 124 from FIG. 3c are mounted to carrier 140 and foil layer 142 using, for example, a pick and place operation with active surface 130 oriented toward the carrier. FIG. 4c shows semiconductor die 124 mounted to foil layer 142 of carrier 140 as reconstituted or reconfigured wafer 144.

Reconstituted wafer 144 can be processed into many types of semiconductor packages, including embedded wafer level ball grid array (eWLB), fan-in wafer level chip scale packages (WLCSP), reconstituted or embedded wafer level chip scale packages (eWLCSP), fan-out WLCSP, flip-chip packages, three dimensional (3D) packages, such as package-on-package (PoP), or other semiconductor packages. Reconstituted wafer 144 is configured according to the specifications of the resulting semiconductor package. In one embodiment, semiconductor die 124 are placed on carrier 140 in a high-density arrangement, i.e., 300 micrometers (µm) apart or less, for processing fan-in devices. In another embodiment, semiconductor die 124 are separated by a distance of 50 µm on carrier 140. The distance between semiconductor die 124 on carrier 140 is optimized for manufacturing the semiconductor packages at the lowest unit cost. The larger surface area of carrier 140 accommodates more semiconductor die 124 and lowers manufacturing cost as more semiconductor die 124 are processed per reconstituted wafer 144. The number of semiconductor die 124 mounted to carrier 140 can be greater than the number of semiconductor die 124 singulated from semiconductor wafer 120. Carrier 140 and reconstituted wafer 144 provide the flexibility to manufacture many different types of semiconductor packages using different size semiconductor die 124 from different sized semiconductor wafers 120.

In FIG. 4d, an encapsulant or molding compound 146 is deposited over semiconductor die 124 and carrier 140 using a paste printing, compressive molding, transfer molding, liquid encapsulant molding, vacuum lamination, spin coating, or other suitable applicator. In particular, encapsulant 146 covers the four side surfaces and back surface 128 of semiconductor die 124. Encapsulant 146 can be polymer composite material, such as epoxy resin with filler, epoxy acrylate with filler, or polymer with proper filler. Encapsulant 146 is non-conductive and environmentally protects the semiconductor device from external elements and contaminants. Encapsulant 146 also protects semiconductor die 124 from degradation due to exposure to light.

In FIG. 4e, carrier 140 and foil layer 142 are removed by chemical etching, mechanical peeling, chemical mechanical planarization (CMP), mechanical grinding, thermal bake, UV light, laser scanning, or wet stripping to expose active surface 130 and conductive layer 132. Back surface 128 of semiconductor die 124, as well as the sides of the semiconductor die, remain covered by encapsulant 146 as a protective panel to increase yield, particularly when surface mounting the semiconductor die.

Reconstituted wafer 144 is subject to warpage or bending, as shown in FIG. 4f, after removal of carrier 140 and foil layer 142 due to differences in CTE of semiconductor die 124 and encapsulant 146, as well as chemical cure shrinkage effect of the encapsulant. For a circular carrier 140 with a diameter of 305 mm, reconstituted wafer 144 may exhibit a warpage or bend of −2.0 mm.

Having noted the warpage issue, FIG. 6a returns to the state of reconstituted wafer 144 prior to removal of carrier 140 and foil layer 142. In particular, FIG. 6a shows a plan view of circular reconstituted wafer 144 with semiconductor die 124 mounted to foil layer 142 and carrier 140 and covered by encapsulant 146, i.e., consistent with FIG. 4d. Carrier 140 has sufficient size to accommodate multiple semiconductor die 124 arranged in columns and rows across the carrier.

A conventional layout of carrier 140 would suggest that a maximum number of semiconductor die 124 should be placed on carrier 140, i.e., all available carrier space should be utilized. The layout of semiconductor die should use all available space of the carrier for maximum throughput of die per carrier. However, to reduce the warpage of reconstituted wafer 144, certain areas of carrier 140 are left open space, i.e., no semiconductor die 124 are mounted to predetermined and selected areas of carrier 140. In the case of FIG. 6a, no semiconductor die 124 is mounted to central area 147 of carrier 140. In other words, whereas central area 147 could have accommodated at least one semiconductor die 124, the central area of carrier 140 is devoid of the potential semiconductor die 124. FIG. 6b shows a cross-sectional view of reconstituted wafer 144 taken along line segment 6b-6b of FIG. 6a with no semiconductor die 124 mounted to central area 147 of carrier 140.

Figure 7A:
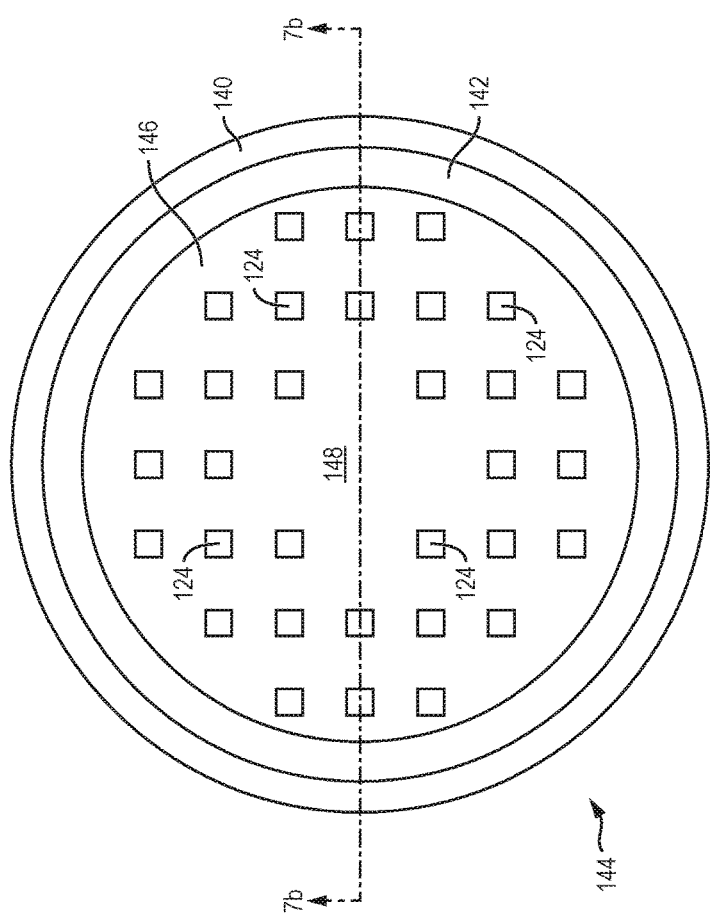
FIGS. 7a-7b illustrate a circular reconstituted wafer with multiple semiconductor die absent from a center of the wafer.
Figure 7B:
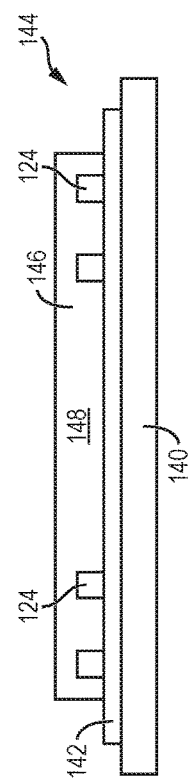

In another embodiment, FIG. 7a shows a plan view of circular reconstituted wafer 144 prior to removal of carrier 140 with semiconductor die 124 mounted to foil layer 142 and carrier 140 and covered by encapsulant 146. To reduce the warpage of reconstituted wafer 144 after removal of carrier 140, central area 148 is left open space, i.e., no semiconductor die 124 are mounted to central area 148 of carrier 140. Whereas central area 148 could have accommodated multiple semiconductor die 124 in one or more partial rows and columns of available space, the central area of carrier 140 is devoid of those potential semiconductor die 124. In particular, area 148 that is devoid of semiconductor die 124 has a "+" shape, as shown in FIG. 7a. FIG. 7b shows a cross-sectional view of reconstituted wafer 144 taken along line segment 7b-7b of FIG. 7a with no semiconductor die 124 mounted in central area 148 of carrier 140.

In another embodiment, FIG. 8a shows a plan view of circular reconstituted wafer 144 prior to removal of carrier 140 with semiconductor die 124 mounted to foil layer 142 and carrier 140 and covered by encapsulant 146. To reduce the warpage of reconstituted wafer 144 after removal of carrier 140, areas 150 is left open space, i.e., no semiconductor die 124 are mounted to areas 150 of carrier 140. Whereas areas 150 could have accommodated multiple semiconductor die 124 in one or more partial rows and columns of available space, areas 150 of carrier 140 are devoid of those potential semiconductor die 124. In particular, areas 150 that are devoid of semiconductor die 124 include a central region of carrier 140 and interstitial locations within the rows and columns of semiconductor die 124, as shown in FIG. 8a. For example, the leftmost column of semiconductor die 124 in carrier 140 has no open locations. The second leftmost column of semiconductor die 124 in carrier 140 has one open interstitial location between the upper two semiconductor die 124 and the lower two semiconductor die 124. The third leftmost column of semiconductor die 124 in carrier 140 has two open interstitial locations. The center column of semiconductor die 124 in carrier 140 has three open interstitial locations alternating between semiconductor die 124. The rightmost column of semiconductor die 124 in carrier 140 has no open locations. The second rightmost column of semiconductor die 124 in carrier 140 has one open interstitial location between the upper two semiconductor die 124 and the lower two semiconductor die 124. The third rightmost column of semiconductor die 124 in carrier 140 has two open interstitial locations. FIG. 8b shows a cross-sectional view of reconstituted wafer 144 taken along line segment 8b-8b of FIG. 8a with no semiconductor die 124 mounted in areas 150 of carrier 140. FIG. 8c shows a cross-sectional view of reconstituted wafer 144 taken along line segment 8c-8c of FIG. 8a with no semiconductor die 124 mounted in areas 150 of carrier 140.

The absence of semiconductor die 124 from selected areas 147-148 or 150 of carrier 140 reduces bending stress in that area of the carrier. By leaving selected areas 147-148 or 150 of carrier 140 devoid of semiconductor die 124, the warping effect of any mismatch between the CTE of semiconductor die 124 and the CTE of encapsulant 146 on reconstituted wafer 144 after removal of carrier 140 is reduced. In the case of circular carrier 140, depopulating semiconductor die 124 from central areas 147-148 or areas 150 of carrier 140 has a significant effect on out-of-plane deformation. Without semiconductor die 124 in central areas 147-148 or areas 150, CTE mismatch and modulus are reduced as the deflection point is shifted away from the center of the carrier. Any warpage at peripheral regions of carrier 140 should dominate after removal of the carrier. Retaining semiconductor die 124 around a perimeter of carrier 140 helps maintain structural rigidity for the ease of handling. Alternatively, non-functional dummy die or other stiffening support components are disposed around a perimeter of carrier 140 for structural rigidity and ease of handling.

The number and location of areas 147-148 or 150 of carrier 140 absent semiconductor die 124 is a function of the size and shape of the carrier. For circular carrier 140 with a diameter of 305 mm and given five to ten semiconductor die 124 absent from a "+" shape area 148, the post carrier removal warpage is reduced to about −1.4 mm in a 14×14 eWLB package. The reduction in warpage increases yield through subsequent manufacturing processes, e.g., formation of the interconnect structure of FIG. 4g, without significant loss of overall throughput, even given the fact there are fewer semiconductor die 124 per carrier 140. The yield loss due to the absence of some semiconductor die 124 from carrier 140 is mitigated in part by the lower failure rate of the semiconductor die during formation of the interconnect structure in subsequent manufacturing processes.

In addition, the absence of semiconductor die 124 from central areas 147-148 or areas 150 reduces stiffness of reconstituted wafer 144. Depending on the device structure, some reconstituted wafers exhibit an abrupt change of warpage, for example, directly from −2.0 mm to +2.0 mm. By selectively removing semiconductor die 124 from central areas 147-148 or areas 150, reconstituted wafer 144 relaxes and the warpage can be adjusted to the acceptable range.

Figure 9:
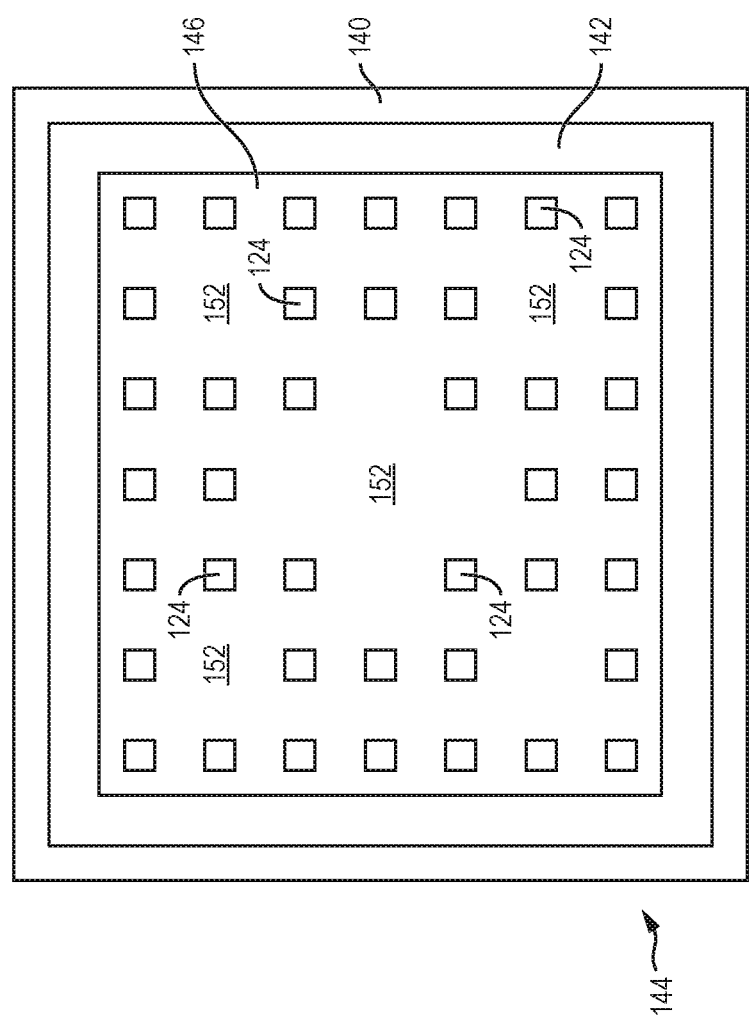
FIG. 9 illustrates a rectangular reconstituted wafer with interstitial open locations on the carrier.

FIG. 9 shows a plan view of rectangular reconstituted wafer 144 prior to removal of carrier 140 with semiconductor die 124 mounted to foil layer 142 and carrier 140 and covered by encapsulant 146. To reduce the warpage of reconstituted wafer 144 after removal of carrier 140, areas 152 is left open space, i.e., no semiconductor die 124 are mounted to areas 152 of carrier 140. Whereas areas 152 could have accommodated multiple semiconductor die 124 in one or more partial rows and columns of available space, areas 152 of carrier 140 are devoid of those potential semiconductor die 124. In particular, areas 152 that are devoid of semiconductor die 124 include a central region of carrier 140 and interstitial locations within the rows and columns of semiconductor die 124, as shown in FIG. 9. The leftmost column of semiconductor die 124 in carrier 140 has no open locations. The second leftmost column of semiconductor die 124 in carrier 140 has two open interstitial locations. The third leftmost column of semiconductor die 124 in carrier 140 has one open interstitial location. The center column of semiconductor die 124 in carrier 140 has three open and concurrent interstitial locations. The rightmost column of semiconductor die 124 in carrier 140 has no open locations. The second rightmost column of semiconductor die 124 in carrier 140 has two open interstitial locations. The third rightmost column of semiconductor die 124 in carrier 140 has one open interstitial location.

Figure 10:
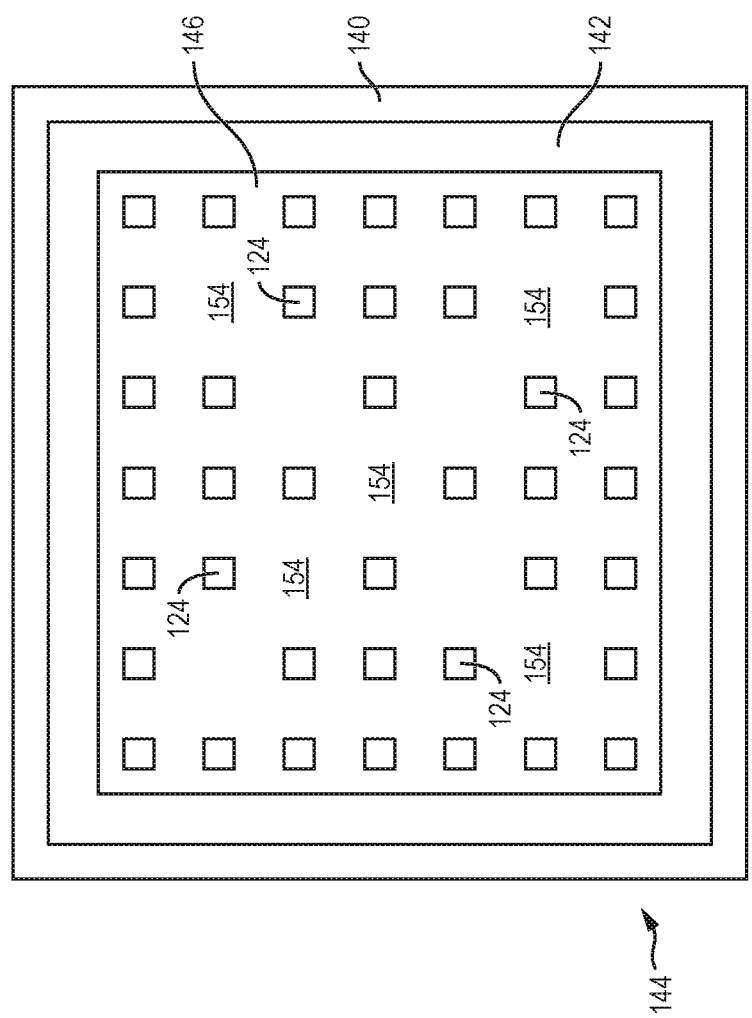
FIG. 10 illustrates another rectangular reconstituted wafer with interstitial open locations on the carrier.

FIG. 10 shows a plan view of another embodiment of rectangular reconstituted wafer 144 prior to removal of carrier 140 with semiconductor die 124 mounted to foil layer 142 and carrier 140 and covered by encapsulant 146. To reduce the warpage of reconstituted wafer 144 after removal of carrier 140, areas 154 is left open space, i.e., no semiconductor die 124 are mounted to areas 154 of carrier 140. Whereas areas 154 could have accommodated multiple semiconductor die 124 in one or more partial rows and columns of available space, areas 154 of carrier 140 are devoid of those potential semiconductor die 124. In particular, areas 154 that are devoid of semiconductor die 124 include a central region of carrier 140 and interstitial locations within the rows and columns of semiconductor die 124, as shown in FIG. 10. The leftmost column of semiconductor die 124 in carrier 140 has no open locations. The second leftmost column of semiconductor die 124 in carrier 140 has two open interstitial locations. The third leftmost column of semiconductor die 124 in carrier 140 has two open interstitial locations. The center column of semiconductor die 124 in carrier 140 has one open interstitial location. The rightmost column of semiconductor die 124 in carrier 140 has no open locations. The second rightmost column of semiconductor die 124 in carrier 140 has two open interstitial locations. The third rightmost column of semiconductor die 124 in carrier 140 has two open interstitial locations.

Figure 11:
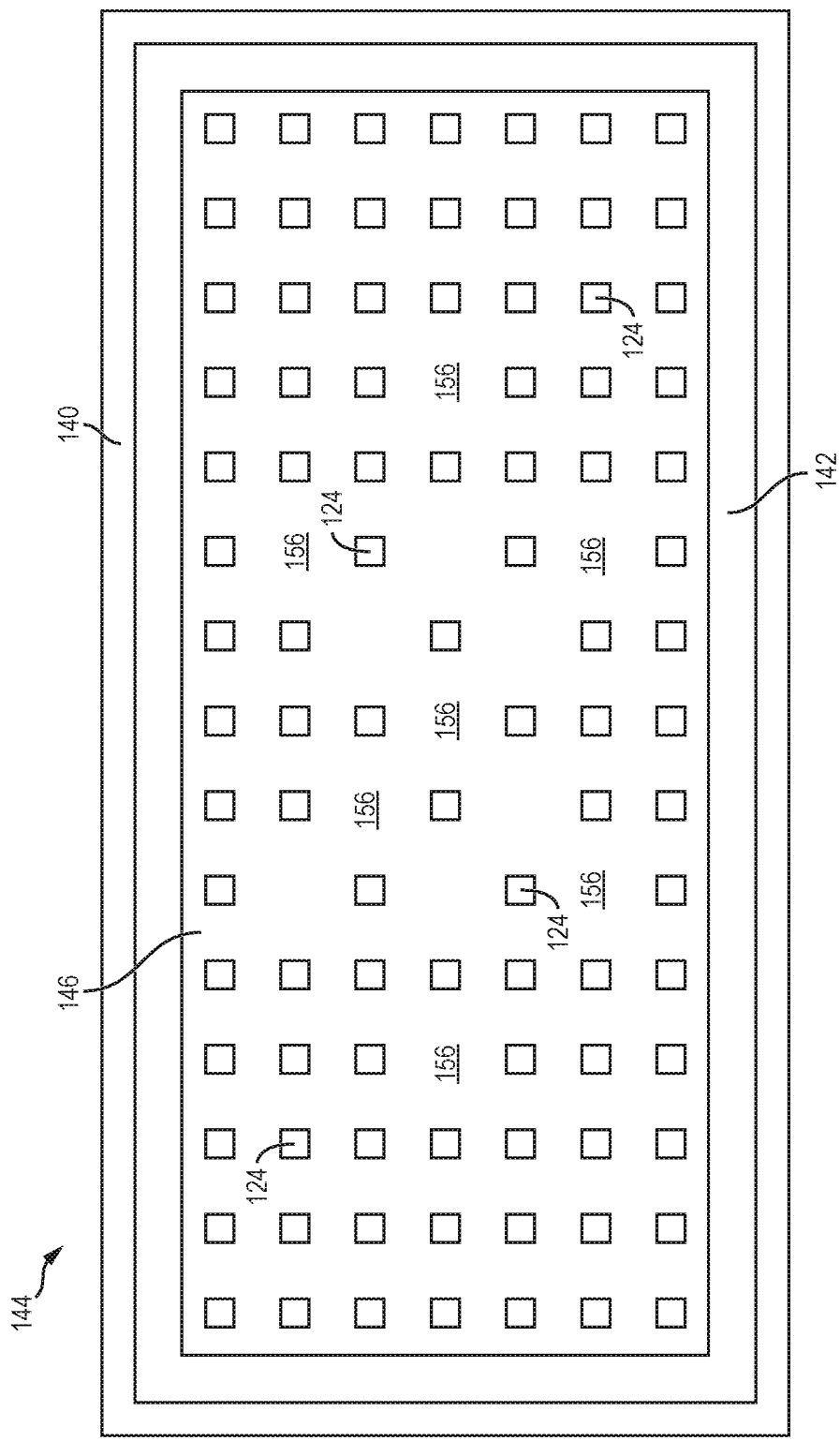
FIG. 11 illustrates another rectangular reconstituted wafer with interstitial open locations on the carrier.

FIG. 11 shows a plan view of another embodiment of rectangular reconstituted wafer 144 prior to removal of carrier 140 with semiconductor die 124 mounted to foil layer 142 and carrier 140 and covered by encapsulant 146. To reduce the warpage of reconstituted wafer 144 after removal of carrier 140, areas 156 is left open space, i.e., no semiconductor die 124 are mounted to areas 156 of carrier 140. Whereas areas 156 could have accommodated multiple semiconductor die 124 in one or more partial rows and columns of available space, areas 156 of carrier 140 are devoid of those potential semiconductor die 124. In particular, areas 156 that are devoid of semiconductor die 124 include a central region of carrier 140 and interstitial locations within the rows and columns of semiconductor die 124, as shown in FIG. 11.

Figure 12:
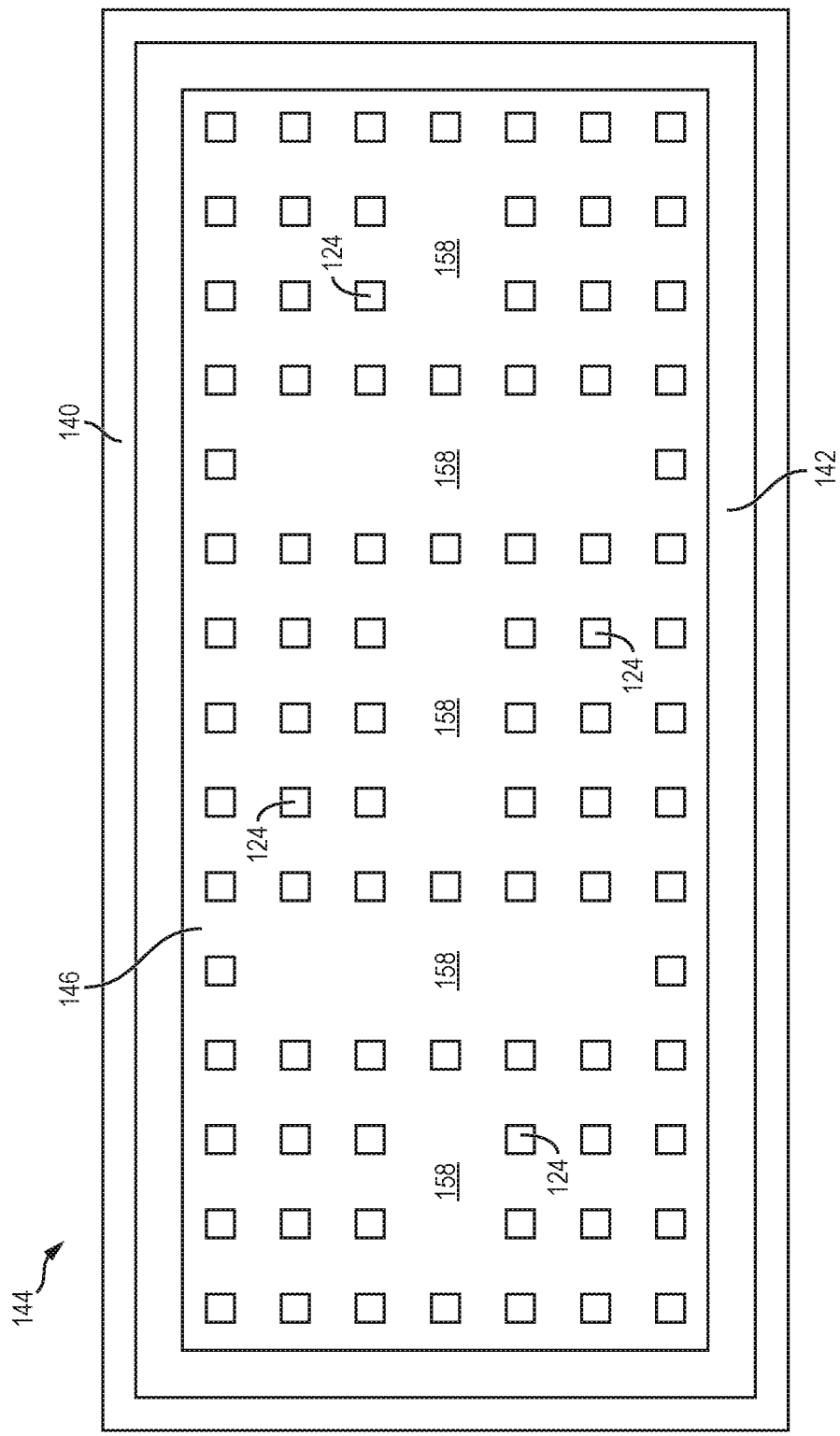
FIG. 12 illustrates another rectangular reconstituted wafer with interstitial open locations on the carrier.

FIG. 12 shows a plan view of another embodiment of rectangular reconstituted wafer 144 prior to removal of carrier 140 with semiconductor die 124 mounted to foil layer 142 and carrier 140 and covered by encapsulant 146. To reduce the warpage of reconstituted wafer 144 after removal of carrier 140, areas 158 is left open space, i.e., no semiconductor die 124 are mounted to areas 158 of carrier 140. Whereas areas 158 could have accommodated multiple semiconductor die 124 in one or more partial rows and columns of available space, areas 158 of carrier 140 are devoid of those potential semiconductor die 124. In particular, areas 158 that are devoid of semiconductor die 124 include a central region of carrier 140 and interstitial locations within the rows and columns of semiconductor die 124, as shown in FIG. 12.

The absence of semiconductor die 124 from selected areas 152-158 of carrier 140 in FIGS. 9-12 reduces bending stress in that area of the carrier. By leaving selected areas 152-158 of carrier 140 devoid of semiconductor die 124, the warping effect of any mismatch between the CTE of semiconductor die 124 and the CTE of encapsulant 146 on reconstituted wafer 144 after removal of carrier 140 is reduced. In the case of a rectangular carrier 140, depopulating semiconductor die 124 from areas 152-158 of carrier 140 has a significant effect on out-of-plane deformation. Without semiconductor die 124 in areas 152-158, CTE mismatch and modulus reduced as the deflection point is shifted away from the center of the carrier. Any warpage at peripheral regions of carrier 140 should dominate after removal of the carrier. Retaining semiconductor die 124 around a perimeter of carrier 140 helps maintain structural rigidity for the ease of process handling.

Figure 4G:
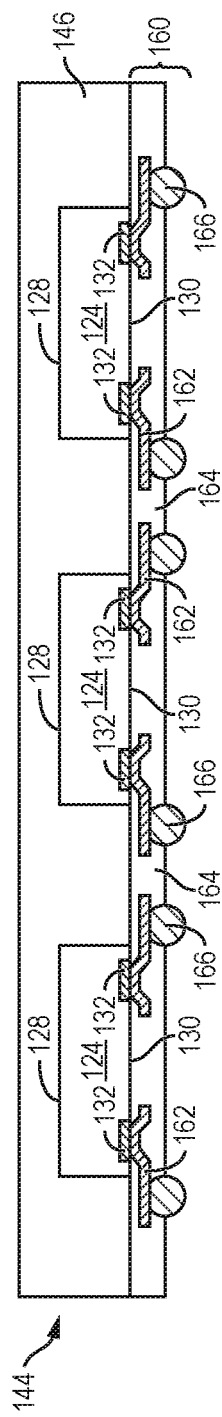

The reduction in warpage increases yield through subsequent manufacturing processes, e.g., formation of the interconnect structure of FIG. 4g, without significant loss of overall throughput, even given the fact there are fewer semiconductor die 124 per carrier 140. The yield loss due to the absence of some semiconductor die 124 from carrier 140 is mitigated in part by the lower failure rate of the semiconductor die during formation of the interconnect structure in subsequent manufacturing processes.

In addition, the absence of semiconductor die 124 from areas 152-158 reduces stiffness of reconstituted wafer 144. Depending on the device structure, some reconstituted wafers exhibit an abrupt change of warpage, for example, directly from −2.0 mm to +2.0 mm. By selectively removing semiconductor die 124 from areas 152-158, reconstituted wafer 144 relaxes and the warpage can be adjusted to the acceptable range.

Returning to FIG. 4g and again after removal of carrier 140, a build-up interconnect structure 160 is formed over semiconductor die 124 and encapsulant 146. Build-up interconnect structure 160 includes an electrically conductive layer or redistribution layer (RDL) 162 formed using a patterning and metal deposition process such as sputtering, electrolytic plating, or electroless plating. Conductive layer 162 can be one or more layers of Al, Cu, Sn, Ni, Au, Ag, or other suitable electrically conductive material. One portion of conductive layer 162 is electrically connected to conductive layer 132. Other portions of conductive layer 162 can be electrically common or electrically isolated depending on the design and function of semiconductor die 124.

An insulating or passivation layer 164 is formed around and between conductive layers 162 using PVD, CVD, printing, lamination, spin coating, spray coating, sintering or thermal oxidation. The insulating layer 164 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 164 is removed by an etching process or laser direction ablation (LDA) to expose conductive layer 162.

An electrically conductive bump material is deposited over conductive layer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form balls or bumps 166. In some applications, bumps 166 are reflowed a second time to improve electrical contact to conductive layer 162. In one embodiment, bumps 166 are formed over an under bump metallization (UBM) layer. Bumps 166 can also be compression bonded or thermocompression bonded to conductive layer 162. Bumps 166 represent one type of interconnect structure that can be formed over conductive layer 162. The interconnect structure can also use bond wires, conductive paste, stud bump, micro bump, or other electrical interconnect.

Figure 4H:
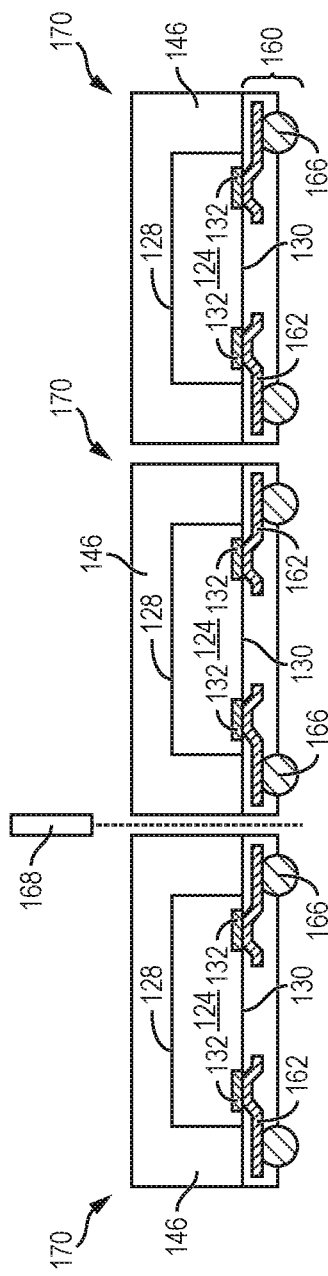

In FIG. 4h, semiconductor die 124 are singulated through encapsulant 146 with saw blade or laser cutting tool 168 into individual eWLB 170. FIG. 5 shows eWLB 170 after singulation. Semiconductor die 124 is electrically connected to conductive layer 162 and bumps 166 for external interconnect. The eWLB 170 may undergo electrical testing before or after singulation. The absence of semiconductor die 124 from selected areas of carrier 140 reduces bending stress in that area of the carrier. By leaving selected areas of carrier 140 devoid of semiconductor die 124, the warping effect of any mismatch between the CTE of semiconductor die 124 and the CTE of encapsulant 146 on reconstituted wafer 144 after removal of carrier 140 is reduced. The reduction in warpage increases yield through subsequent manufacturing processes using standard semiconductor processing tools without significant loss of overall throughput, even given the fact there are fewer semiconductor die 124 per carrier 140.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a plurality of die attach locations each with a predetermined uniform area arranged in columns and rows across the substrate;
   disposing a plurality of semiconductor die over a first number of the die attach locations on the substrate, while leaving a second number of die attach locations on the substrate with spacing capable of accommodating additional ones of the semiconductor die devoid of the semiconductor die; and
   depositing an encapsulant over the semiconductor die and substrate, wherein the encapsulant occupies the second number of die attach locations.

2. The method of claim 1, wherein the second number of die attach locations is disposed in a central area of the substrate.

3. The method of claim 1, wherein the second number of die attach locations is disposed in a linear segment of the substrate.

4. The method of claim 1, wherein the second number of die attach locations is disposed in an interstitial area of the substrate.

5. The method of claim 1, wherein the substrate includes a circular shape or rectangular shape.

6. A method of making a semiconductor device, comprising:
   providing a substrate including a plurality of die placement locations;
   disposing a plurality of semiconductor die over a first number of die placement locations on the substrate, while leaving a second number of die placement locations on the substrate with spacing capable of accommodating additional ones of the semiconductor die devoid of the semiconductor die; and
   depositing an encapsulant over the semiconductor die and substrate including in the second number of die placement locations.

7. The method of claim 6, wherein the second number of die placement locations is disposed in a central area of the substrate.

8. The method of claim 6, wherein the second number of die placement locations is disposed in a linear segment of the substrate.

9. The method of claim 6, wherein the second number of die placement locations is disposed in an interstitial area of the substrate.

10. The method of claim 6, wherein the substrate includes a circular shape or rectangular shape.

11. The method of claim 6, wherein the second number of die placement locations is disposed in partial rows and columns of available space on the substrate.

12. The method of claim 6, wherein the die placement locations are arranged in columns and rows across the substrate.

13. A method of making a semiconductor device, comprising:
    providing a substrate including a plurality of die placement locations;
    disposing a plurality of semiconductor die over a first number of die placement locations on the substrate, while leaving a second number of die placement locations on the substrate with spacing capable of accommodating additional ones of the semiconductor die devoid of the semiconductor die;
    removing the substrate; and
    forming an interconnect structure over the semiconductor die.

14. A semiconductor device, comprising:
    a substrate including a plurality of die placement locations; and
    a plurality of semiconductor die disposed over a first number of the die placement locations on the substrate, while leaving a second number of the die placement locations on the substrate with spacing capable of accommodating additional ones of the semiconductor die devoid of the semiconductor die; and
    an encapsulant deposited over the semiconductor die and substrate including in the second number of die placement locations.

15. The semiconductor device of claim 14, wherein the second number of die placement locations is disposed in a central area of the substrate.

16. The semiconductor device of claim 14, wherein the second number of die placement locations is disposed in a linear segment of the substrate.

17. The semiconductor device of claim 14, wherein the second number of die placement locations is disposed in an interstitial area of the substrate.

18. The semiconductor device of claim 14, wherein the substrate includes a circular shape or rectangular shape.

19. The semiconductor device of claim 14, wherein the second number of die placement locations is disposed in partial rows and columns of available space on the substrate.

20. The method of claim 14, wherein the die placement locations each have a predetermined uniform area arranged in columns and rows across the substrate.

21. A semiconductor device, comprising:
    a substrate including a plurality of die placement locations; and
    a plurality of semiconductor die each occupying a predetermined area and disposed over a first number of the die placement locations on the substrate, while leaving a second number of die placement locations on the substrate with spacing capable of accommodating additional ones of the semiconductor die having the predetermined area devoid of the semiconductor die; and
    an encapsulant deposited over the semiconductor die and substrate including in the second number of die placement locations.

22. The semiconductor device of claim 21, wherein the second number of die placement locations is disposed in a central area of the substrate.

23. The semiconductor device of claim 21, wherein the second number of die placement locations is disposed in a linear segment of the substrate.

24. The semiconductor device of claim 21, wherein the second number of die placement locations is disposed in an interstitial area of the substrate.

25. The semiconductor device of claim 21, wherein the substrate includes a circular shape or rectangular shape.

26. The semiconductor device of claim 21, wherein the die placement locations are arranged in columns and rows across the substrate.

* * * * *